(12) United States Patent
Hussain et al.

(10) Patent No.: US 8,450,392 B2
(45) Date of Patent: May 28, 2013

(54) PAINT COMPOSITION

(75) Inventors: Shahid Hussain, Reading (GB);
Christopher Robert Lawrence,
Farnborough (GB); **Philip Mark
Shryane Roberts**, Woodcote (GB)

(73) Assignee: Qinetiq Limited, London (GB)

( * ) Notice: Subject to any disclaimer, the term of this patent is extended or adjusted under 35 U.S.C. 154(b) by 515 days.

(21) Appl. No.: 12/863,534

(22) PCT Filed: Jan. 28, 2009

(86) PCT No.: PCT/GB2009/000226
§ 371 (c)(1),
(2), (4) Date: Jul. 19, 2010

(87) PCT Pub. No.: WO2009/095654
PCT Pub. Date: Aug. 6, 2009

(65) Prior Publication Data
US 2010/0291291 A1    Nov. 18, 2010

(30) Foreign Application Priority Data

Jan. 31, 2008 (GB) .................................. 0801686.7

(51) Int. Cl.
*C09D 5/33* (2006.01)
*C09D 5/32* (2006.01)
*C09D 5/24* (2006.01)

(52) U.S. Cl.
CPC ... *C09D 5/24* (2013.01); *C09D 5/32* (2013.01)
USPC ............................. 523/137; 106/489; 252/514

(58) Field of Classification Search
CPC ...................................................... C09D 5/24
USPC ........................... 523/137; 252/514; 106/489

See application file for complete search history.

(56) References Cited

U.S. PATENT DOCUMENTS

| 4,363,889 A | * | 12/1982 | Hoshino et al. | ............... | 523/513 |
| 6,013,203 A | * | 1/2000 | Paneccasio et al. | ........... | 252/512 |
| 7,160,375 B2 | * | 1/2007 | Yamamoto | ................... | 106/31.6 |

FOREIGN PATENT DOCUMENTS

CN    1315477         10/2001
CN    1315477 A    * 10/2001

(Continued)

OTHER PUBLICATIONS

Derwent Abstract of JP 60147480 A (Acc. No. 1985-226901, Aug. 1995).*

(Continued)

*Primary Examiner* — Ling Choi
*Assistant Examiner* — Brieann R Fink
(74) *Attorney, Agent, or Firm* — Nixon & Vanderhye P.C.

(57) ABSTRACT

This invention relates to the field of an electromagnetic (EM) field shielding paint compositions, in particular, those capable of providing substantially non metallic finish. The paint composition finds particular use in attenuating EM signals that may be used to carry data between communication devices, especially mobile phone and wi-fi devices. EM field shielding paints are typically available in jet-black or bright metallic finishes and usually possess limited scratch & abrasion resistance. The paint composition provides a one-pot solution to furnish a composition which has the visual appearance of a domestic type paint i.e. one with a non-metallic finish, with the ability to shield electromagnetic radiation. The composition comprises a supported metallic flake and a pigment, which have been provided in a narrowly defined range to furnish a desirable non-metallic appearance and possess electromagnetic shielding properties.

20 Claims, 4 Drawing Sheets

FOREIGN PATENT DOCUMENTS

| | | | |
|---|---|---|---|
| CN | 2917207 Y | * | 6/2007 |
| EP | 0 241 927 | | 10/1987 |
| GB | 2 115 396 | | 9/1983 |
| JP | 60147480 A | * | 8/1985 |
| JP | 2006143798 A | * | 6/2006 |
| KR | 2003-0041645 | | 5/2003 |
| KR | 10-2005-0061969 | | 6/2005 |
| KR | 10-2005-0066211 | | 6/2005 |
| KR | 10-2006-0039277 | | 5/2006 |
| KR | 10-2006-0078790 | | 7/2006 |

OTHER PUBLICATIONS

Machine translation of CN 1315477 (Oct. 2001, 4 pages).*
Machine translation of JP 2006-143798 (Jun. 2006, 9 pages).*
Machine translation of CN 2917207 (Jun. 2007, 5 pages).*
International Search Report for PCT/GB2009/000226, mailed Jun. 4, 2009.
Written Opinion of the International Searching Authority for PCT/GB2009/000226, mailed Jun. 4, 2009.
UK Search Report for GB 0801686.7, dated Jun. 27, 2008.

* cited by examiner

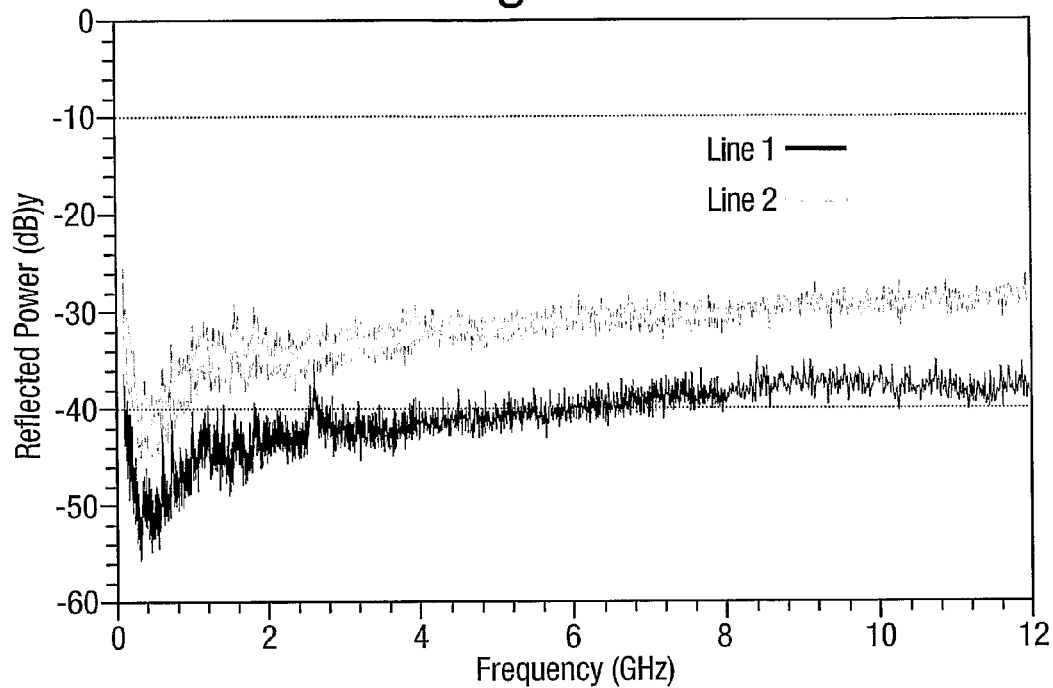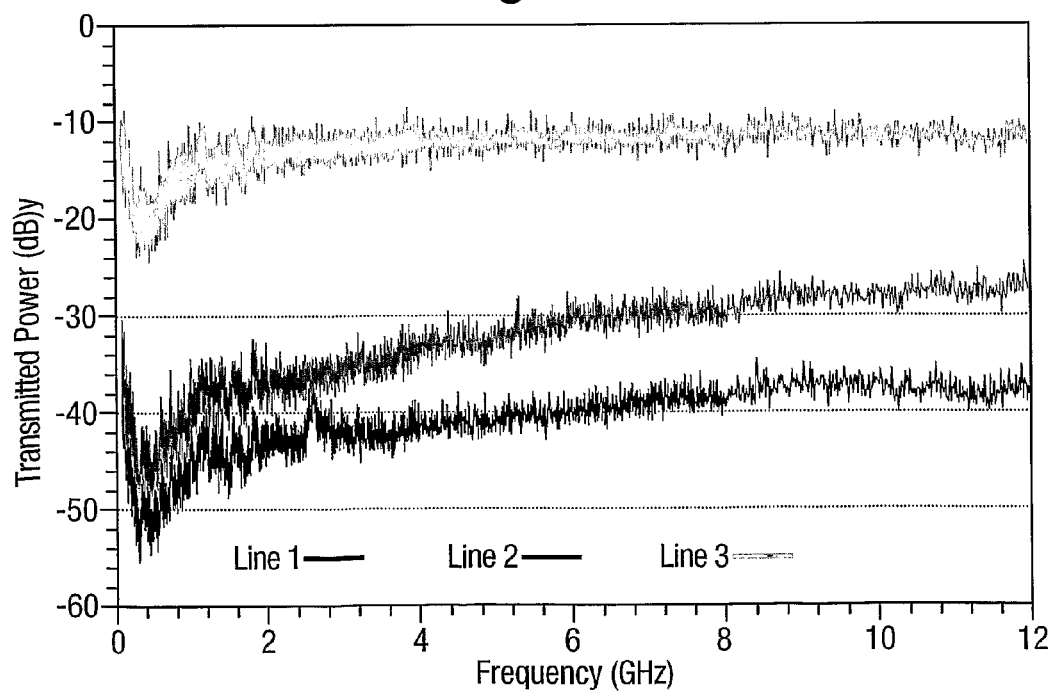

PAINT COMPOSITION

This application is the U.S. national phase of International Application No. PCT/GB2009/000226 filed 28 Jan. 2009 which designated the U.S. and claims priority to GB Application No. GB 0801686.7 filed 31 Jan. 2008; the entire contents of each of which are hereby incorporated by reference.

This invention relates to the field of an electromagnetic (EM) field shielding paints, in particular, those capable of providing a substantially non metallic finish. The paint composition finds particular use in attenuating EM signals that may be used to carry data between communication devices, especially mobile phone and wi-fi devices. It particularly relates to an EM field shielding paint for decorating internal and/or external surfaces to screen radiation that is transmitted or received by wireless communications devices, such as mobile phones, and other data carrying signals which occur in the microwave & radio frequencies. There are further provided coated surfaces comprising the paint composition, methods of attenuating EM radiation, and methods of use of such a composition, such that a surface coated in the composition is capable of attenuating EM radiation.

EM field shielding paints are typically available in jet-black or bright metallic finishes and usually possess limited scratch & abrasion resistance. The former compositions contain high loadings of carbon/graphite in a particulate form that form a black surface. The latter paints generate a shiny metallic finish due to the high loadings of metal particulates. The presence of a black surface or a shiny metallic surface may be indicative of function and not serve as a suitable decorative finish in a habitable environment. Therefore, these paints generally need to be over-painted with a number of coats of household paint to achieve a satisfactory visual appearance.

According to a first aspect of the invention there is provided an electromagnetic shielding paint composition capable of providing a non-metallic finish, comprising a supported metallic flake with an average flake size of less than 100 microns, present in the range of from 20 to 45 volume % of dried volume, a paint pigment present in the range of from 2 to 20 volume % of dried volume, and a binder. By capable of providing a non metallic finish, we mean that the final dried paint layer or coating does not have a metallic, shiny or glitter-type effect, as is usually observed with metallic flake containing paints.

The paint composition may comprise a liquid formulation prior to application, or be in the form of a dried paint layer or coating after its application. Preferably the liquid formulation may comprise at least one solvent.

By supported metallic flake, we mean a flake comprising a metallic coating on a supporting substrate.

The volume percentages hereinbefore and hereinafter are defined as a volume percentage of the final dried composition (i.e. without solvent). However, in order to facilitate the composition being deposited or applied in the form of a layer, a solvent may be present. It is desirable to add sufficient solvent such that the composition may be applied to achieve a final dried layer thickness similar to that of a typical domestic paint composition. Commercial decorative paints are produced to give a dried layer typically in the region of 20 to 60 microns.

Preferably the supported metallic flake is present in an amount of 25 to 45 volume %, more preferably 30 to 45 volume %, yet more preferably 35 to 40 volume %, all based on dried volume.

The supported metallic flake preferably has an average flake size that is between 20 to 100 microns, more preferably in the range of 30 to 60 microns (assuming a normal distribution). Where processing methods give rise to other particle size distributions, not more than 25% by weight of the flakes should exceed 100 microns, preferably 60 microns.

In a highly preferred arrangement, the average particle size of the supported metallic flake is substantially the same as or less than the thickness of a typical dried paint layer. Where a coating is formed from separate, subsequently applied sub-layers i.e. individually applied single layers, the flake size in each sub layer may not exceed the sub-layer thickness. Therefore, supported metallic flakes when selected in the range of 30 to 60 microns, or more preferably 30 to 50 microns, such as for example metallic flakes with an average particle size of 30 to 50 microns, allow the supported metallic flakes to possess a similar longest dimension or average flake size to that of a typical single dried paint layer, and hence able to achieve good alignment and good electrical contact between neighbouring supported metallic flakes; this overlapping is often referred to as a leafing effect. The overlap of supported metallic flakes ensures good electrical conductivity across the area of the deposited paint.

The supported metallic flake preferably has an average thickness of less than 4 microns (total thickness i.e. support+conductive metallic layer); more preferably, the average thickness is in the range of from, 1 to 3 microns, or even 1 to 2 microns. The supported metallic flake preferably has an average thickness to average flake size ratio of 1:10 to 1:25, preferably the average thickness of the supported metallic flake is less than approximately $\frac{1}{10}^{th}$ the thickness of a typical single layer of dried paint composition.

Flakes selected in these ranges have been shown, by SEM, to allow a number of supported metallic flakes to stack on top of each other, and hence to provide good coverage and good electrical contact across the whole area of a layer of dried paint composition. If the supported metallic flakes are too thick compared to their length, the flakes are less likely to adopt a stacked arrangement, which may reduce the degree of electrical contact across the whole area of a layer of dried paint composition.

The supported metallic flake may be any support with a conductive metallic coating. The conductive metallic coating may cover all sides of the support or at least be one or more layers on at least one of the elongate surfaces, more preferably the upper and lower elongate surfaces are coated with one or more layers of conductive metallic coatings, which may be the same material or different in each layer. Preferably, the metallic coating has high conductivity and more preferably also possesses a bright white finish, so as to provide the final paint composition with a lighter colour finish; yet more preferably the metal is a sliver-coloured metal, most preferably the metal is silver. (While silver in a solid metal flake form would provide shielding, it would be prohibitively expensive and its increased mass may cause sedimentation of the flake in the formulation).

The metallic coating may be selected from any metal that exhibits very high conductance, such as for example gold, nickel or copper, as they also exhibit very high conductance. However, they may not enable the paint composition to achieve light (neutral) decorative colours. These metals may only readily permit orange/yellow colours, or darker colours.

The support may be made from any material which is capable of being produced as a substantially flat or more preferably an optically flat surface to permit the desirable leafing effect and furthermore it must be able to support a metallic surface finish. The support may be any material such as a conductive material, such as a metal, or it may be a non-conductive material. The support may be a metal flake or non metal flake such as a ceramic or glass. It may be desirable to use an inexpensive metal in flake form and coat the surface with a more highly conductive or brighter metal, such as for example coating a cheaper metal flake with a surface coating of silver.

Preferably the support is a glass flake, which may be produced by any known process. A highly preferred process for the formation of glass flakes comprises shattering large glass bubbles that shatter into tiny fragments, which inherently possess optically smooth surfaces. The glass flakes are then coated with a conductive metal, preferably silver, by any known process.

The leafing effect is enhanced by increasing the degree of optical smoothness, i.e. flatness of the supported metal flake. The greater the degree of flatness, the more facile is the overlap and stacking of neighbouring supported metallic flakes. In contrast, solid metal flakes are typically made by grinding/squashing spherical metal particles. This method of formation does not usually provide the same degree of optically smooth surface, as found in glass flakes. Accordingly, in a highly preferred embodiment the supported metallic flake is a glass supported metal flake, yet more preferably a glass flake coated with silver metal.

The thickness of the metallic coating on the support needs to be present in an amount sufficient to provide a low electrical resistance supported metallic flake. Typically, the metallic coating is 10-20 wt % of the total flake weight.

The paint pigment provides a dulling effect and effectively removes the metallic, shiny and glitter-type effect of a metallic flake painted surface. However, the problem is not merely one of how to change the visual appearance of a painted surface. The problem is to provide a paint composition where the pigment and supported metal flake are selected in the appropriate proportions and dimensions, which do not reduce the overlapping between adjacent supported metallic flakes and hence maintains the electrical conductance across a dried layer of composition, therefore, maintaining the EM attenuating properties of a metal loaded shielding paint.

A composition as outlined above, which contains significantly greater than 45 volume % of supported metallic flake, will provide a layer of dried composition which is able to attenuate EM radiation. However, at very high volume percentage inclusions of supported metallic flake it is not possible to provide a dried paint coating with a non-metallic looking finish. A non-metallic finish paint is usually required for decorative purposes, such as, for example, a decorative paint suitable for decorating a habitable environment. A decorative paint may be considered to have an appearance which is visually acceptable to a person in their living or working habitat, i.e. a paint which does not provide a lustrous, metallic or shiny appearance. The colour of the paint composition may be any colour but is usually not black, and more usually, will be selected from any light coloured paint; typically the colour may be that of any paint sold for household, or workplace use.

A metallic looking surface can be considered to possess a high degree of 'lustre', i.e. the reflectivity changes dramatically with viewing angle. Furthermore, metallic looking surfaces when viewed from close range (<30 cm) appear 'grainy' due to the presence of visually identifiable metallic flakes.

For example, metallic car paints are typically formulated to provide a deliberate shiny reflective effect. However, metallic car paints contain very small amounts of metallic particles. The metallic particles may be present as flakes or more commonly as spherical particles. Clearly, spherical particles will only be able to achieve point contact with adjacent spherical particles and hence reduce the electrical conductance of the dried composition. The degree of leafing or overlap will also be significantly reduced for any substantially non-linear shaped particles.

Furthermore, as metallic car paints are designed merely to provide a lustrous effect, the metal flake is present in a small volume percentage, essentially to minimise costs and allow for ease of application. Therefore metallic car paints will not possess metallic flake in a sufficient amount to allow the required degree of overlapping or leafing to occur between adjacent metallic flakes, and hence will not provide a high conductance layer, and so such a paint layer will have only a negligible EM shielding effect.

A further advantage of this invention is to produce a decorative electromagnetic shielding paint composition, whose reflectivity is largely invariant with viewing angle, and furthermore does not possess a noticeably 'grainy' effect, especially when viewed from close range.

The paint pigment may be any opaque paint pigment. Preferably the pigment is a particulate and is present in the range of from 2 to 20 volume %, preferably 5 to 10 volume %, more preferably 8 to 10 volume %, all based on dried volume.

The paint pigment preferably has an average particle size diameter in the range of 150 to 500 nm, more preferably an average particle size diameter in the range of 200-250 nm. The paint pigment will preferably have a tint reducing power higher than 1700, preferably a tint reducing power higher than 1900.

Any paint pigment may be used, provided it has sufficient opacity and tint reducing power. Preferably the paint pigment is $TiO_2$. If the pigment has insufficient opacity and tint reducing power, the pigment will not be able to sufficiently hide the supported metal flake during the drying process, hence a grainy shiny effect may be observed.

The macro-appearance of metal-flake containing paints relates to their appearance when viewed from approximate distances of >1 m, and refers to their gonioapparent properties. Metallic effect paints are typically strongly gonioapparent, and display a strong colour 'flop' effect, i.e., the colour and/or brightness depends on the angle of illumination and/or observation. When metallic surfaces are viewed at angles close to the specular reflection angle they can appear very bright, but when viewed at large aspecular angles, they can appear much darker. This contrasts with conventional, decorative (i.e. non metallic finish paints) whose appearance is largely unchanged with viewing angle.

ASTM E 2194-03 (International Standards on colour and appearance measurement) provides standardised methods to quantify the gonioapparent properties of a metal-flake containing surface. The paint's surface is illuminated at 45° to the surface normal, and the colour measured at a near specular angle (15° aspecular), a face angle (45° aspecular) and flop angle (110° aspecular). Metallic effect paints show a large decrease in brightness ('L' value) at the flop angle, 70-90% lower than the brightness at the near specular angle. In contrast, a white opal glass material shows a near constant brightness as a function of aspecular angle.

Compositions according to the invention have been measured in accordance with the main requirements of ASTM E 2194-03, and have been found to be substantially non-metallic in appearance. The compositions exhibited flop-angle reductions in brightness of less than 35%, whereas commercially available metallic paint compositions (showing a degree of 'metallic-ness') showed flop-angle reductions of 65%.

Therefore, compositions according to this invention preferably display a flop-angle which is 40% or less in its brightness compared to the near-specular brightness, more preferably the reduction is 35% or less.

The micro-appearance of metal-flake containing paints refers to appearance when viewed from closer range, and encompasses graininess, glitter, granularity, glint and mottle. Metallic paint can exhibit high levels of these properties, whereas conventional decorative paints do not. A methodology to quantify these effects through image analysis has been proposed (CS McCamy, Observation and Measurement of the appearance of metallic materials. Part II. Micro appearance, *Color Research and Application*, 1998, 23 (6), 362).

Clearly, it is possible to overcome the metallic effect by using very high loadings of $TiO_2$, however this has been shown, in the examples below, significantly to reduce the EM shielding effect per thickness of dried composition, to a level which provides very poor performance. It is desirable to use $TiO_2$ grades that have a tint reducing power of at least 1700, with a surface treatment <18%, and a crystal size 230 nm, preferably high opacity $TiO_2$ pigments, which possess alumina-zirconia surface treatment (<7%), and possess a relative tint reducing power of 1900, refractive index of 2.7 and a mean crystal size of 220 nm are used.

These high opacity grades of $TiO_2$ exhibit improved dispersion characteristics and obscure the supported metallic flake from the view of the human eye in a dried layer of the composition.

In a further preferred embodiment the pigment has had a surface treatment, such as, for example a coating of alumina-zirconia, preferably the surface treatment is present in the range 1 to 20 weight volume %, preferably in the range 1-7 weight volume %.

It may be desirable to add further pigments and/or dyes to the composition, such as to provide different coloured paints. In one example, a light green coloured composition has been formulated using 7 volume % $TiO_2$ plus 1 volume % phthalocyanine green. There may be one or more non-white or coloured further pigments added to the composition, such further pigments may include, for example, inorganic or organic pigments such as metal oxides, phthalocyanines, or azo pigments etc.

The size of the paint pigment and size of the supported metal flake are selected to provide a composition where the paint pigment does not disrupt the overlap or leafing effect of the supported metal flake and hence does not reduce the EM shielding effect for a given thickness of dried composition. Preferably the metallic flake has an average flake size of in the range of 30 to 50 microns and the pigment has a particle size diameter in the range of 200-250 nm.

The solvents and binders used in the paint composition may contribute to the effectiveness of the paint pigment to overcome and dull the metallic effect. A water-based polyurethane paint was found to require at least 8 volume % of $TiO_2$, to eliminate substantially the metallic appearance. It was found that an organic solvent based acrylic composition required only 5 volume % $TiO_2$, to eliminate substantially the metallic appearance.

To retain the respective particulate components of the composition in suspension during application, the paint may further comprise one or more high-shear thickeners, low-shear thickeners, and dispersion additives. These compositions are known in the art.

The binder may be selected from any commercially available paint binder; preferably it may be selected from an acrylic binder, a urethane & epoxy-modified acrylic binder, a polyurethane binder, an alkyd based binder, which may be a modified alkyd, or from fluoropolymer based binders. There is a desire to move towards the reduction of volatile solvents and focus on water based dispersions. The composition according to the invention may be formulated in a water-based dispersion. These dispersions may comprise binders, which are selected from acrylic binders, or from polyurethane based latexes. The binders, thickeners and dispersion agents make up the remainder of the dried volume percentage of the paint composition. However, in certain cases there may be very small amounts of solvent trapped in the substantially dried layer.

Clearly the binders, thickeners and dispersion agents as routinely used in paint formulations are not volatile and so will typically not be lost during the curing i.e. drying process. In contrast to the binders, the solvent that is added to aid deposition or application may evaporate during the drying process.

One highly preferred composition according to the invention, when applied in the form of a single layer using a one-coat formulation, and applied in a manner to give a thickness of a typical one-coat paint composition, achieved a dried layer thickness of composition in the order of 57 microns. This dried layer provided at least 30 dB attenuation over the frequency range of 0.1 to 10 GHz. It has further been found that a two-coat composition achieved a total dried thickness, in the order of 43 microns, i.e. the final dried layer contained two layers of dried composition. The dried layer provided at least 40 dB attenuation over the frequency range of 0.1 to 7 GHz.

The above composition according to the invention provided attenuation regardless of the signal polarization and had a low surface resistance (1-10 $\Omega$/m).

The attenuation is caused over a wide frequency range of the EM spectrum, and moreover spans the typical mobile communication device frequency range. These devices may be mobile phones, or other wireless communications devices, such as, for example wi-fi devices. Typically mobile phones operate in several discreet frequency bands, such as, for example, 0.9 GHz and 1.8 GHz.

According to a further aspect of the invention there is provided a coated surface, structure or body or portions thereof comprising at least one dried coating or layer according to the invention. To provide enhanced levels of shielding, an interior and exterior wall of a building may be coated further to attenuate EM radiation. Accordingly there may be at least one layer of said composition on a further side of said structure or body, or portion thereof.

It will be clear to the skilled man as to how much coverage of the composition according to the invention is required on a surface, body or structure to achieve the desired level of EM attenuation. The attenuation is preferably sufficient to cause the data carried within the EM signal to be unreadable by a remote receiver or transceiver. The transceiver, may be a mobile communication device, such as a computer wi-fi or mobile phone etc, or may be part of a communications network. The paint composition, when applied to a surface in the form of a coating, disrupts communication between at least one transceiver and another transceiver or receiver.

The extent of the coverage of the dried paint composition on a surface, body or structure will depend on whether or not there are any other routes for the EM radiation to ingress. It may be desirable to shield a particular room within a building from EM radiation, such as, for example, to prevent the transmission of, or receiving of, information between mobile communications devices. It will be clear to the skilled man that greater attenuation will be achieved if all surfaces of the room are covered, i.e. all walls, ceiling and the floor. However, in many buildings there may be extensive metal frameworks and so only one or two walls may need a covering to give an effective shield against EM radiation.

According to a further aspect of the invention there is provided the use of a composition according to the invention, wherein the composition is applied to a surface, structure or body or portions thereof as at least one coat or layer to provide a decorative paint capable of attenuating electromagnetic radiation in the frequency of 0.1 to 20 GHz.

There is further provided the use of a composition according to the invention, to attenuate electromagnetic radiation in the frequency of 0.1 to 20 GHz through a surface, structure or body to which at least one layer said of said composition has been applied. This use may be particularly suited to attenuate electromagnetic radiation emitted by or received by wi-fi devices or mobile communication devices, so that they are unable to send out, or receive in data via electromagnetic radiation.

There is accordingly provided a method of providing shielding from electromagnetic radiation in the frequency of 0.1 to 20 GHz through a barrier, structure or body or portions thereof, comprising the step of applying at least one coat of a composition according to the invention to a first side, and optionally a second side, of said barrier, structure or body or portion thereof. The barrier may be any surface, such as for example a wall that is capable of being coated on at least two sides, and may be located such that it attenuates EM radiation between communication devices or communications networks.

A further advantage is that the use of a decorative paint in a habitable environment, such as for example, walls, floors or ceilings in a building, room or office, is more discrete than the overt presence of a black surface or shiny metallic surface. A yet further advantage is that it provides a one-pot composition without the need for further standard decorative paints to be painted on top.

Accordingly there is further provided a method of providing a surface, structure or body or portions thereof with electromagnetic shielding properties, wherein one or more dried coating layers of the composition according to the invention are applied to said surface, structure or body. Particular advantage is found when the dried paint coating forms the exposed topmost layer, i.e. said coating is left exposed or untreated.

Clearly, all paints lose their decorative appeal over a period of time, and so the dried layer may at a later point in time be coated with a standard domestic paint, and still retain the EM shielding properties. Alternatively, a further coat of a composition according to the invention may be applied.

A number of thickeners and solvents may be added to the composition in order to improve the flow of the paint and its adherence to different surfaces. Low shear thickeners, such as Rohm & Haas Acrysol 2020®, Borchers BorchGel 0621® allow the pigments to remain in suspension during storage and application. In addition, for the 2-coat composition, a high shear thickening agent such as BorchGel 0434® allows the paint composition to maintain high shear viscosity stabilisation during brush/roller application.

It may be desirable to alter the viscosity of the composition by the addition of a solvent system, and these may be selected from fast drying or slow drying solvents, e.g., addition of a small amount of methanol/acetone/isopropanol in place of some of the water in the water-based systems. The addition of a small aliquot of an organic solvent to a water based system decreases the drying time in the initial part of the drying phase, additionally it was found to improve the ability of the binders to 'lock' the pigments in place. However, the use of organic solvents is becoming less desirable in interior paint systems as manufacturers are moving towards paint compositions with low Volatile Organic Concentration (VOC), classification as 'low' (<7.99%).

It may also be desirable to include a dispersion additive, such as Borchers BorchGen 0451®, to maximise the dispersion of the $TiO_2$ particles within the composition, this helps to avoid agglomerations of particles. This is desirable as agglomeration may reduce the paint pigments ability to dull the metallic surface effect and may also interfere with flake alignment and thus electrical conductivity in a dried composition.

The paint composition preferably comprises a plurality of parallel aligned supported metallic flakes, which in the final dried coating form a stacked arrangement, where their longest length is substantially parallel to the surface, structure or body to be coated.

Embodiments of the invention are described below by way of example only and with reference to the accompanying drawings in which:

FIG. 3 shows a graph of the attenuation achieved over a frequency range for a one-coat composition and two coat composition.

FIG. 4 shows a graph of the attenuation achieved over a frequency range for a one-coat composition, a two-coat composition and a prior art carbon paint composition.

Figure 1:
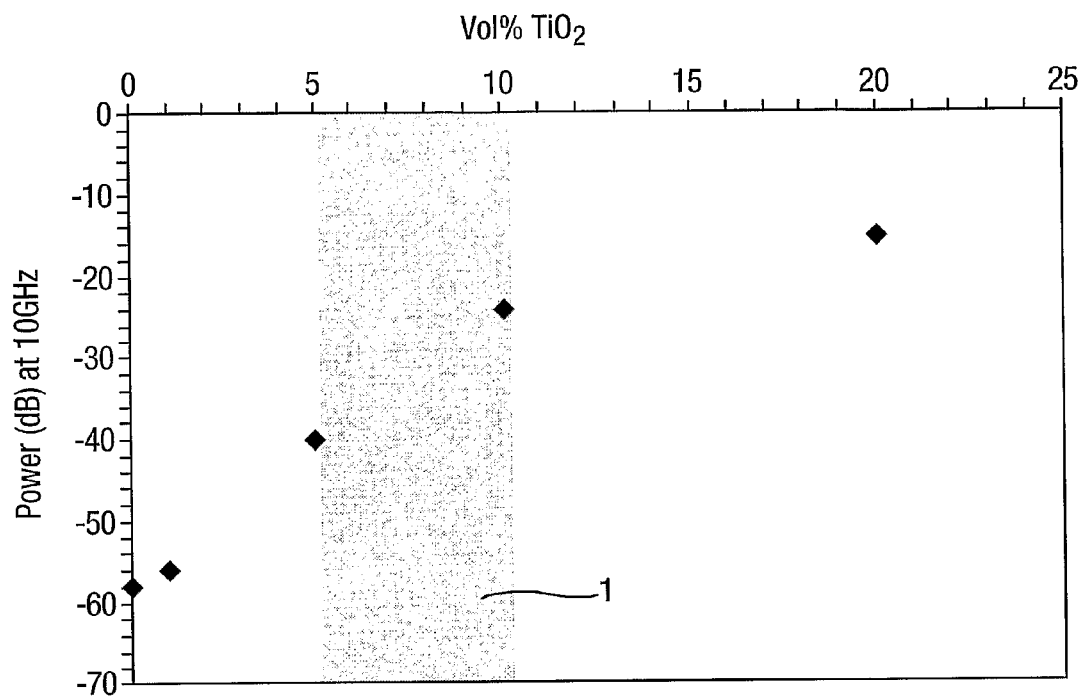
FIG. 1 shows a graph of showing the correlation between increasing $TiO_2$ inclusion and concomitant reduction of attenuation.

Turning to FIG. 1, this shows a graph of the EM screening performance, at a fixed frequency of 10 GHz for a solvent-based acrylic composition using 35 volume % flake, (with respect to the dried composition), similar to the percentage amounts defined in Example 2. The composition was prepared using different percentage inclusions of the paint pigment $TiO_2$. As can be seen from the graph, the shaded area 1 shows the highly preferred region where the $TiO_2$ content is sufficient to hide the flake, but not too high so as significantly to reduce the EM shielding performance. The trend from the graph indicates that at greater than 20 volume % inclusion of paint pigment that the EM shielding effect is likely to be very poor and would therefore provide only minimal benefit. At very low percentages of $TiO_2$, the EM shielding effect of the composition is increased. However, this produces an undesirable metallic looking paint composition, which is clearly not suitable for decorative or discrete application purposes.

Figure 2:
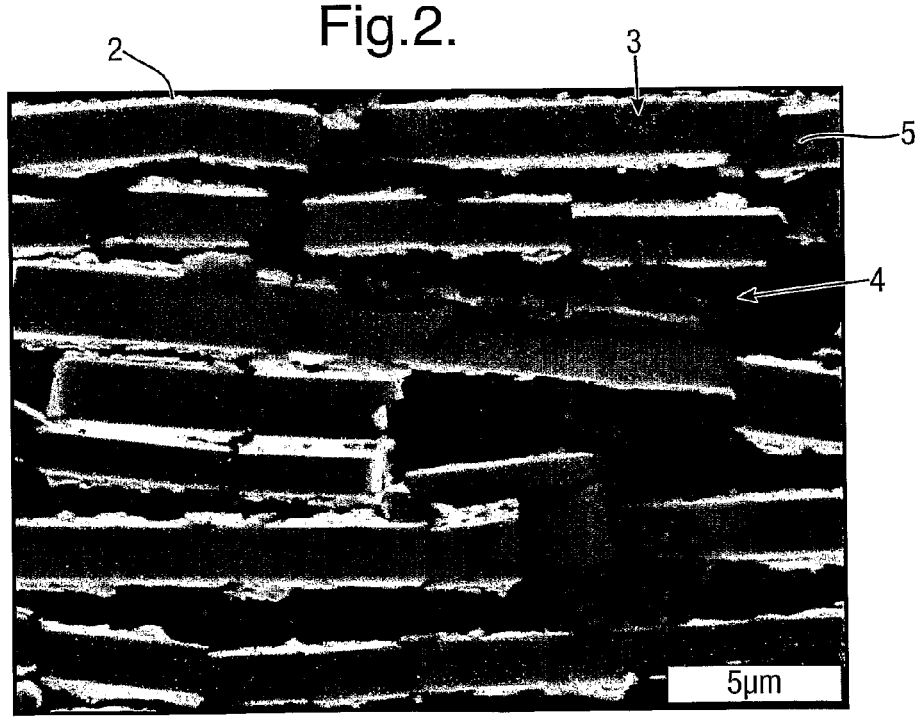
FIG. 2 shows an SEM of a composition according to the invention.

FIG. 2 shows an SEM picture of a dried composition, which possesses 40 volume % of glass coated flake and 8 volume % of $TiO_2$ pigment, in a binder. The supported metallic flakes 3 possess a glass core 5, with a surface coating of silver metal 2. The SEM shows that the dried composition possesses excellent alignment between adjacent flakes and hence good electrical contact between adjacent flakes. This therefore ensures good electrical conductivity across the total area of the dried paint composition and hence good EM shielding properties. It is also possible to observe the $TiO_2$ particles 4, which lie in the voids between the supported metallic flakes 3.

FIG. 3 shows a graph of the reflected power, for compositions as defined in Example 1 and Example 2, over a defined frequency range, up to 12 GHz. Line 1 refers to the 1-coat screening paint as defined in Example 1, which is applied to provide a 57 µm dry layer thickness. Line 2 refers to the 2-coat screening paints as defined in Example 2, which is applied to provide a 43 µm dry layer total thickness (total for both layers). Both compositions show excellent attenuation over the frequency ranges used by typical communication devices.

FIG. 4 shows a graph of the transmitted power for compositions as defined in Example 1 and Example 2, over a defined frequency range, up to 12 GHz. Lines 1 and 2 are the same compositions as described in FIG. 3. The graph further shows Line 3, which relates to a high carbon loaded screening paint. The attenuation achieved by the carbon loaded paint is significantly less than the metallic flake compositions according to the invention. The carbon loaded paint also has the further problem of requiring masking of the black colour; this will require several coats of lighter coloured decorative paint on top of the carbon loaded paint.

Figure 5:
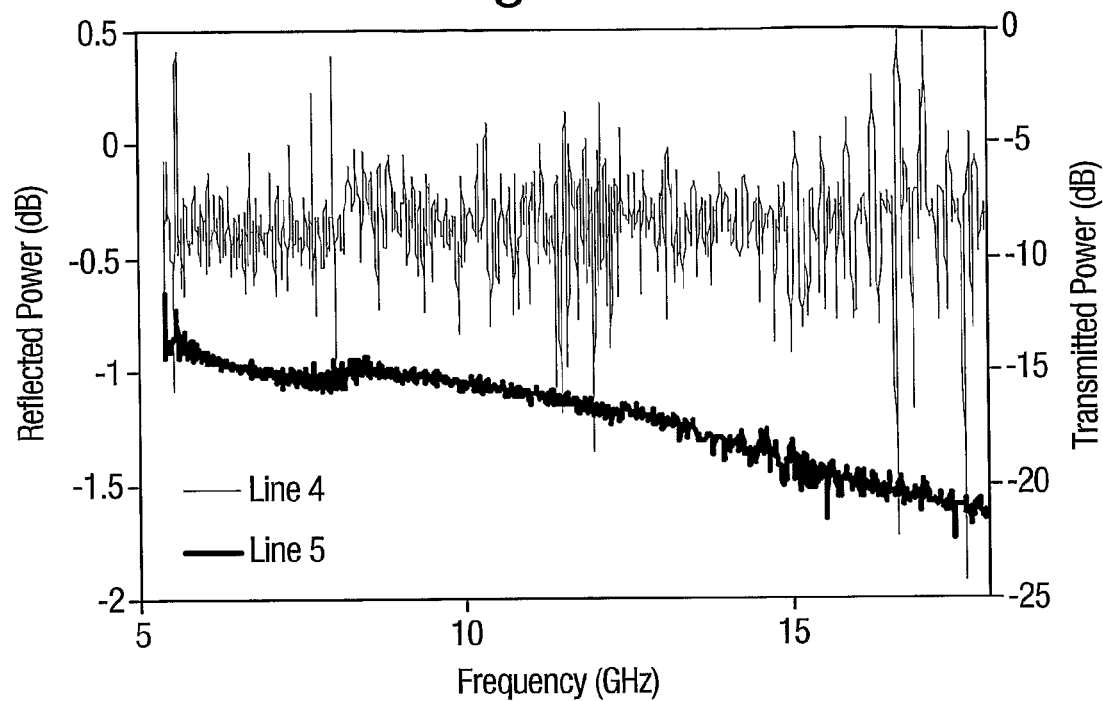
FIG. 5 shows a graph of the reduction in attenuation for a composition containing very high percentage inclusion of $TiO_2$.

FIG. 5 shows a graph of the reflected power line 4 and transmitted power line 5 for a solvent based acrylic paint composition containing a high percentage inclusion of $TiO_2$. The composition possesses 35 volume % flake and 20 volume % $TiO_2$. As can be seen from the graph, 20 volume % $TiO_2$ loading provides only a small degree of attenuation. This is a relatively poor performance compared to the performance which is achievable using highly preferred amounts of $TiO_2$, present in the range of from 5-10 volume %, as shown in FIGS. 1, 3 and 4. The poor performance is due to high $TiO_2$ loading, which causes disruption in the alignment and concomitant electrical connection between overlapping supported metal flake particles. Compositions which contain greater than 25 volume % of $TiO_2$ will provide a composition which exhibits a small degree of attenuation, the level of attenuation will typically be undesirable.

Figure 6:
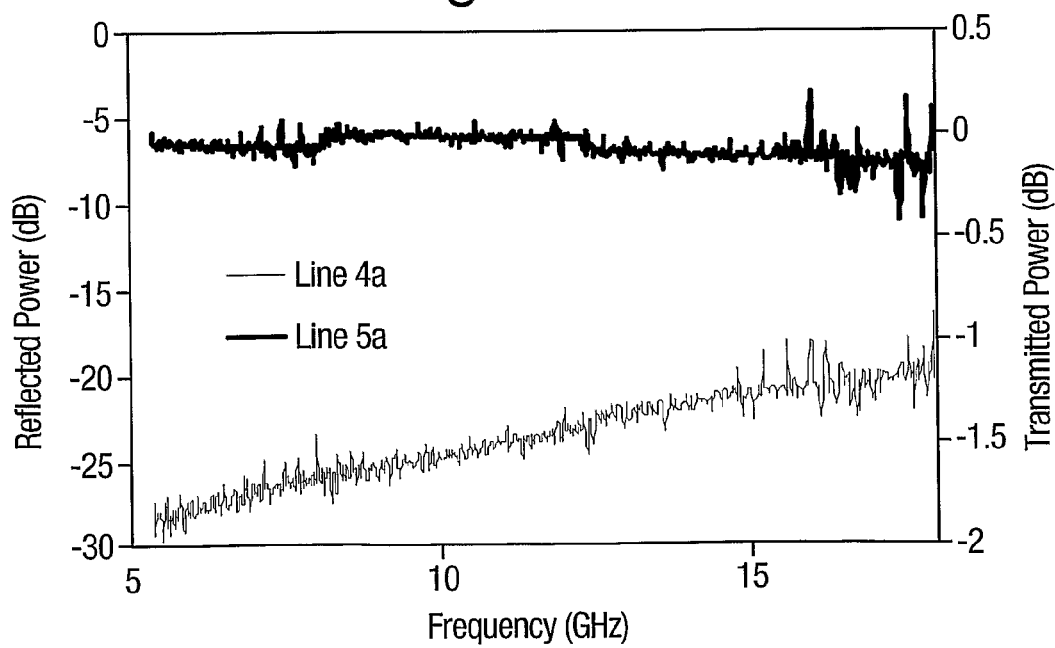
FIG. 6 shows a graph of the reduction in attenuation for a composition containing low percentage volumes of metallic flake.

FIG. 6 shows a graph of the transmitted power and reflected power for a water-based polyurethane (PU) paint containing low percentage volumes of metallic flake. The composition was prepared with a relatively low level of metallic flake, 25 volume % metallic flake and a typically desirable amount of pigment, 5 volume % $TiO_2$. The graph shows that at low concentrations of metallic flake that the reflected power, line 4a, and transmitted power, line 5a, are very much reduced compared to optimised levels of 30 to 45 volume %, as shown in FIGS. 2 and 3, which relates to preferred ranges in examples 1 and 2. The reduction in attenuation is due to reduced occurrence of overlapping metallic flakes and hence areas in the dried composition which are not electrically conductive. Therefore, in these substantially non-conductive areas, the effect will be significantly reduced, thus allowing electromagnetic radiation to effectively "leak" or propagate through these non-conductive areas or regions.

Compositions with 20-25 volume % of metallic flake are able to provide a degree of attenuation. However, where metallic flake levels are below 20 volume % there is substantially no attenuation, or the attenuation that is achieved is not high enough to be of any significant use for effectively and reliably shielding the EM radiation generated between communication devices.

Figure 7A:
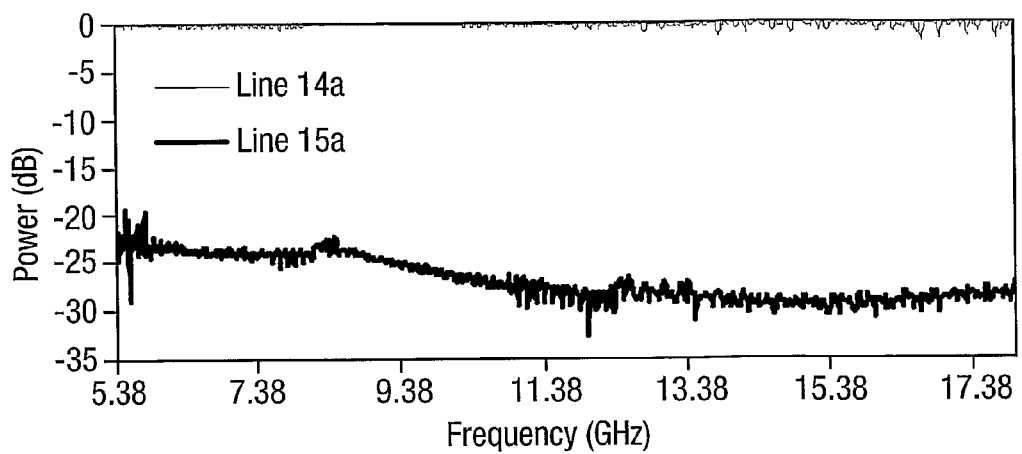
FIGS. 7a to 7c show graphs of the attenuation for compositions incorporating different metallic flake materials.
Figure 7B:
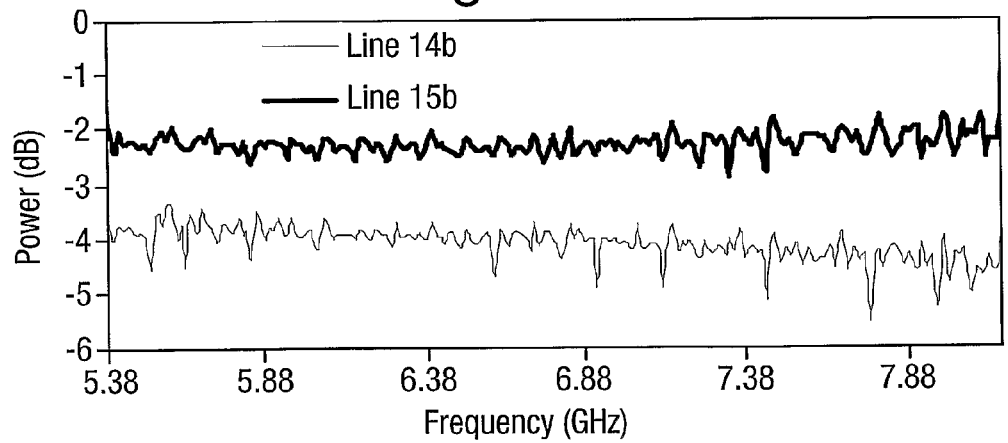
Figure 7C:
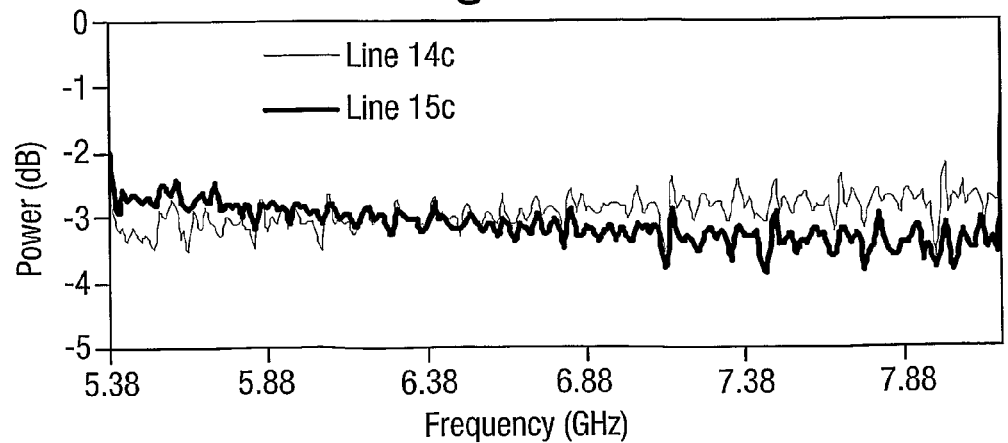

FIG. 7a shows the graph of the attenuation for a silver coated glass flake, FIG. 7b shows the graph of the attenuation for a stainless steel flake and FIG. 7c shows the graph of the attenuation for an aluminium flake, as described in Example 3, below. Lines 14a, 14b and 14c show the reflected power in FIGS. 7a to 7c respectively. Lines 15a, 15b and 15c show the transmitted power in FIGS. 7a to 7c respectively.

EXAMPLE 1

One coat composition comprising 40 volume % of metallic flake

TABLE 1 composition of a one coat composition (40 volume % flake)

| Component | Weight % |
|---|---|
| $TiO_2$ (Runa R900) | 9.95 |
| Disperse agent (BorchiGen 0451) | 0.10 |
| Ag-coated glass flake (Metashine ME3040PS) | 28.03 |
| PU dispersion (ICP W830/364) | 47.55 |
| Water | 11.06 |
| Low shear thickener (Rohm & Haas RM2020) | 3.32 |
| TOTAL | 100.00 |

The silver coated glass flake is provided in the amount of 40 volume %, this is defined with respect to the volume percentage of the final dried paint composition. The compositions defined in Tables 1 and 2 show the relative proportions of the ingredients of the paint composition with a solvent present.

Preparation of 500 ml of one-coat composition:

$TiO_2$ 74.3 g and dispersing agent 0.74 g was added to PU dispersion 355 g and mixed using ball mill. Ag-coated glass flake 209 g was added with gentle stirring and stirred until well dispersed. To this was added water 82.5 g and a thickening agent 24.8 g and the resultant mix was stirred.

The silver coated glass flake was obtained from Metashine ME3040PS, which possess a 3 micron thickness particle with an average particle size of 40 microns.

The composition was applied in one coat, using a short haired roller to a prepared substrate, to provide a maximum coverage of 10 m² per litre. FIG. 3 shows the screening performance of this paint when applied at a thickness of 57 µm.

Screening effectiveness was measured in a stirred mode reverberation chamber. Samples approximately 30×30 cm were clamped in a conductive rig, within a sealed chamber containing a radiation source and a stirring 'paddle' to ensure a completely unpolarised incident field. Transmitted radiation is collected on the other side of the panel in a similar manner. The data is presented relative to a metal panel.

EXAMPLE 2

Two-coat composition comprising 35 volume % of metallic flake

TABLE 2 showing the composition of a two coat composition (35 volume % flake)

| Component | Weight % |
|---|---|
| $TiO_2$ (Kemira RD3) | 8.8 |
| Disperse agent (BorchGen 0451) | 0.1 |
| Ag-coated glass flake (Metashine ME3040PS) | 22.3 |
| PU dispersion (ICP W830/364) | 46.7 |
| Water | 20.6 |
| Low shear thickener (BorchiGel 0621) | 1.2 |
| High shear thickener (BorchGel 0434) | 0.3 |
| TOTAL | 100.00 |

Table 2 showing the composition of a two coat composition (35 volume % flake)

Preparation of 500 ml of two-coat composition $TiO_2$ 60.9 g and dispersing agent 0.6 g was added to a PU dispersion 318 g and mixed using ball mill. Ag-coated glass flake 153.9 g was added to this dispersion and stirred until well dispersed. To a stirred mixture was added water 142.1 g, a low shear thickener 13.5 g and high shear thickener 8.2 g.

The final composition was applied as a first layer to a moderate thickness, using a short haired roller to a prepared substrate, to provide a maximum coverage of 20 m² per litre. A second overcoating layer, was applied to the first layer when it was fully dry, to ensure dry film thickness of at least 40 µm for the two layers. The above composition was tested in a similar fashion to that defined in Example 1. FIG. 3 shows example screening performance for this paint applied at a total thickness of 43 µm.

EXAMPLE 3

A series of formulations were prepared using different metallic flake materials, as shown in Table 3, below.

TABLE 3 selection of metallic flakes

| Flake material | % inclusion flake | % $TiO_2$ | Binder formulation |
|---|---|---|---|
| platinum-silver coated glass flakes) | 35 wt % | 5 wt % | 30% water based PU (W830/364) |
| solid stainless steel flakes | 35 wt % | 5 wt % | VTAC(30 wt %)-based paint |
| solid aluminium flakes | 35 wt % | 5 wt % | VTAC(30 wt %)-based paint |

The results are based on paint formulations applied to a test surface made from Perspex. The average particle size of all of the conducting flake materials was around 40 microns. The stainless steel and aluminium flake formulations were based on dispersions in VTAC to improve dispersion of the metal flakes. Both PU and VTAC binders are both electrically insulating and therefore have similar electromagnetic properties. The results are shown in the graphs in FIGS. 7a to c, and show transmission and reflection from the samples. The results are plotted on a decibels (dB) scale where, for example, 0 dB in transmission corresponds to perfect transmission through the sample (i.e. poor shielding) and anything lower than −20 dB transmission corresponds to over 99% of the signal not being transmitted. The results show that the silver coated glass flakes, (FIG. 7a) provided significantly lowered transmission values, lower dB values i.e. increased shielding effect, over the stainless steel (FIG. 7b) and aluminium (FIG. 7c) solid metal flakes, which are outside of the invention.

EXAMPLE 4

The paint formulation in Example 2 was selected to be tested at a range of coverage thicknesses. The formulation of Example 2 was compared to a commercially available carbon loaded RF shielding paint. The formulations under test and their relative coating thicknesses are shown in Table 4, below.

Example 2 formulation was $TiO_2$ 8 vol %, flake 35 vol %, (NGF Microglass Metashine Flakes (Product code: ME3040PS), average flake diameter of 40 microns and an average thickness of 3 microns.) Polyurethane 52 vol %, thickener approximately 5 vol %, the values are given as volume % of dried volume material.

TABLE 4 formulation data

| Sample | Paint formulation | Thickness(coverage) |
|---|---|---|
| 1: | Example 2 formulation | ~7.5 m²/litre (~55 µm) |
| 2: | Commercially available carbon loaded shielding paint | ~7.5 m²/litre (~55 µm) |
| 3: | Example 2 formulation | ~10 m²/litre. |
| 4: | Commercially available carbon loaded shielding paint | ~10 m²/litre |
| 5: | Example 2 formulation | ~12.5 m²/litre |
| 6: | Commercially available carbon loaded shielding paint | ~12.5 m²/litre. |

The shielding paint formulations Samples 1 to 6 were applied to a commercially available wallpaper lining paper, to act as a support for the paint materials under test. The wallpaper base had no inherent attenuation properties. The attenuation for each Sample 1 to 6 was measured over a range of frequency values. The results are shown in Table 5 below. The data corresponds to UKAS (United Kingdom Accreditation Service) accredited measurements, which were carried out by the QinetiQ EMES Group (Test Certificate Number: QinetiQ/MS/ESS/TC0801381) using the MIL STD 285/IEEE 299 Method.

TABLE 5 attenuation of samples 1 to 6 over a defined frequency range.

| Frequency MHz | Sample 1 dB | Sample 2 dB | Sample 3 dB | Sample 4 dB | Sample 5 dB | Sample 6 dB |
|---|---|---|---|---|---|---|
| 30 | 19.04 | 14 | 18.64 | 10 | 18.73 | 0.44 |
| 60 | 15.38 | 8.44 | 17.42 | 1.6 | 17.48 | 1.47 |
| 100 | 16.38 | 10.8 | 19.16 | 1.9 | 21.04 | 1.16 |
| 300 | 28.76 | 22.2 | 28.21 | 9.66 | 33.12 | 5.97 |
| 600 | 35.24 | 28.72 | 31.25 | 15.35 | 38.3 | 12 |
| 1000 | 35 | 23.96 | 38 | 10.72 | 39 | 8 |
| 2000 | 39.62 | 25.97 | 39 | 14.84 | 36 | 9.7 |
| 4000 | 34.44 | 23.78 | 35.78 | 13.45 | 32.5 | 7.68 |
| 8000 | 34.16 | 24.45 | 31.8 | 13.15 | 32.47 | 8.11 |
| 18000 | 30.11 | 24.73 | 30.85 | 13.2 | 29.3 | 7.73 |

Samples 1, 3 and 5, are formulation of Example 2 applied at different thickness values (as set out in Table 4). As can be seen from Table 5, above, the paint formulation according to the invention, i.e. samples 1, 3 and 5 possess higher dB values (which corresponds to a higher attenuation ability, i.e. better shielding effect), than the commercially available carbon based paint formulation. The increased attenuation values occur at three different coverage thicknesses i.e. 7.5, 10 and 12.5 m²/litre values, and across the full range of frequency measurements. The formulation of the invention is particularly effective at very thin coating thicknesses (i.e. large m²/litre coverage values). Table 5 clearly shows that the carbon based paint's ability to attenuate at 12.5 m²/litre (Sample 6) has been significantly reduced at thin coating thickness, compared to Sample 5, which is the formulation of the invention, which has applied at the same 12.5 m²/litre thickness level.

The decease in effectiveness of the carbon loaded paint, is due to the carbon particles moving further apart and so creating areas or regions of reduced conductance, which leads to a reduction in the attenuation of the surface. Whereas, in the formulation of the invention, the particles are elongate and so have better overlap each other, as defined earlier, and hence maintain a better degree of conductance across the surface layer of the dried formulation.

The invention claimed is:

1. An electromagnetic shielding paint composition capable of providing a non-metallic finish, comprising a supported metallic flake which comprises a non-conductive support with a conductive metallic coating, with an average flake size of less than 100 microns, present in the range of from 20 to 45 volume % of dried volume, a paint pigment present in the range of from 2 to 20 volume % of dried volume, and a binder.

2. A paint composition according to claim 1 wherein the supported metallic flake is present in an amount of 35 to 40 volume % of dried volume.

3. A paint composition according to claim 1, wherein the supported metallic flake has an average flake size of between 20 to 100 microns.

4. A paint composition according to claim 3 wherein the average flake size is in the range of 30 to 50 microns.

5. A paint composition according claim 1, wherein the supported metallic flake has an average thickness of less than 4 microns.

6. A paint composition according to claim 1, wherein the supported metallic flake has an average thickness to average flake size ratio of 1:10 to 1:25.

7. A paint composition according to claim 1, wherein the supported metallic flake is a silver coated glass flake.

8. A paint composition according claim 1 wherein the paint pigment is a particulate, and is present in the range of from 5 to 10 volume % of dried volume.

9. A paint composition according to claim 1 wherein the paint pigment has an average particle size diameter in the range of from 150 to 500 nm.

10. A paint composition according to claim 9 wherein the paint pigment has an average particle size diameter in the range of 200-250 nm.

11. A paint composition according to claim 1 wherein the paint pigment is $TiO_2$.

12. A paint composition according to claim 1 wherein the metallic flake has an average flake size of in the range of 30 to 50 microns and the pigment has an average particle size diameter in the range of 200-250 nm.

13. A paint composition according to claim 1, wherein there further comprises one or more types of non-white paint pigment.

14. A paint composition according to claim 1 wherein the paint composition is a liquid formulation and comprises a solvent.

15. A paint composition according to claim 1, wherein the composition is in the form of a dried coating.

16. A paint composition according to claim 15, wherein said dried coating comprises two or more sub-layers, which have been separately applied.

17. A paint composition according to claim 15 wherein the average flake size of the supported metallic flake is substantially the same or less than the thickness of the dried paint coating.

18. A paint composition according to claim 17 wherein the average thickness of the supported metallic flake is less than 1/10 of the thickness of the dried paint coating.

19. A coated surface, structure or body or portions thereof comprising at least one dried coating according to claim 16.

20. A method of providing shielding from electromagnetic radiation in the frequency of 0.1 to 20 GHz through a barrier, structure or body, comprising the step of applying at least one coat of a paint composition according to claim 1 to a first side, and optionally a second side, of said barrier, structure or body or portion thereof.

* * * * *